United States Patent [19]

Crider et al.

[11] Patent Number: 5,051,671
[45] Date of Patent: Sep. 24, 1991

[54] PROXIMITY SENSOR AND CONTROL

[75] Inventors: Grant W. Crider, Bremen; Nathan J. Smith, Addison, both of Ala.

[73] Assignee: Hired Hand Manufacturing, Inc., Bremen, Ala.

[21] Appl. No.: 590,965

[22] Filed: Oct. 1, 1990

[51] Int. Cl.[5] .............................................. H02P 1/00
[52] U.S. Cl. .................................. 318/466; 318/662; 198/444; 198/577
[58] Field of Search ............... 318/483, 257, 676, 652, 318/443, 444, 638, 662, 466–470, 450, 482, 481, 644; 388/929; 198/444, 524–526, 531, 570–572, 577

[56] References Cited

U.S. PATENT DOCUMENTS

| 4,131,834 | 12/1978 | Blaskowski | 318/483 |
| 4,323,829 | 4/1982 | Witney et al. | 318/257 X |
| 4,541,053 | 9/1985 | Knots et al. | 318/696 X |
| 4,567,410 | 1/1986 | Martin et al. | 318/652 X |
| 4,613,802 | 9/1986 | Kraus et al. | 318/443 X |
| 4,687,979 | 8/1987 | Ashton et al. | 318/638 |
| 4,871,058 | 10/1989 | Shields | 318/662 X |

Primary Examiner—William M. Shoop, Jr.
Assistant Examiner—A. Jonathan Wysocki
Attorney, Agent, or Firm—Jennings, Carter, Thompson & Veal

[57] ABSTRACT

Sensor circuitry which detects the presence or absence of material and activates a motor responsive thereto, having a capacitor which emits electric signal responsive to the presence of the material, a signal processing unit receives the capacitor's signal and shapes it into a usable signal, wherein the usable signal is received by a timer which is held in reset thereby. When the material's presence is no longer detected, the timer counts a delay during which a control signal is output to a control transistor which responsively actuates a relay which is connected to and forms a link of a power circuit that supplies energy to the motor. A transformer is connected to the power circuit and selected windings of the transformer are connected to the relay. When the transistor is off and relay is inactive, there is a large voltage drop across the transformer thereby deactivating the motor. When the relay is actuated by the transistor, a relatively small voltage drop occurs across the transformer and a sufficient flow of energy passes to the motor and activates the same.

5 Claims, 2 Drawing Sheets

PROXIMITY SENSOR AND CONTROL

FIELD OF THE INVENTION

The present invention relates to electronic circuitry and more specifically to electronic circuitry for sensing movement and triggering a selected apparatus in response to such movement. In even greater particularity the present invention relates to capacitance sensors and signal processing units utilized to convert a signal emanating from such capacitance sensors into a subsequent mechanical reaction. In even greater particularity the present invention relates to the sensing of a product at a given location to control the subsequent movement of the product to another location.

BACKGROUND OF THE INVENTION

In the poultry industry, feed grain is commonly delivered to designated areas of an industrial chicken house by a series of conveyors. Typically the amount of grain delivered and the rates at which such grain is delivered has been regulated by a series of electronic sensors operatively connected to the conveyors and spaced along the route the feed grain is determined to travel. Either as a result of improper placement or faulty construction the existing sensors have been unable to closely monitor the movement of such grain or effectively control the volume delivered to the designated areas of the chicken house. Primarily, the existing sensors do not have means for delaying the activation of the conveyors after the movement of the grain has been sensed. Such delay is essential when several sensors are used at varying distances from the conveyor to indicate the location of such grain and to activate the delivery of additional grain.

SUMMARY OF THE INVENTION

It is the principal object of the present invention to provide an apparatus that senses the presence or absence of the material and selectively activates and deactivates a motor in response thereto.

In support of the principal object another object of the present invention is to provide an apparatus that delays activation of the motor a selected time period after such condition is sensed.

Yet another object of the invention is to provide an apparatus having the aforesaid characteristics that receives energy for operation from a power source which supplies energy to the motor, wherein the power source supplying energy to the motor continually supplies energy to the present invention.

These and other objects and advantages of our invention are accomplished through the use of a capacitance proximity sensor which, when actuated by the presence of selected material in close proximity therewith, emits an electrical signal. A signal processing unit connected to the capacitance proximity sensor receives said first signal and shapes the same into a usable signal. The usable signal is received by a timer which is held in a reset position by the signal. When the presence of the selected material is no longer detected, the voltage level of the usable signal changes and the timer counts a delay period during which a control signal is output to a control transistor. The connecting transistor, upon receiving the signal, actuates a relay switch which is connected to and forms a link of a power input circuit that supplies energy to the motor. The present invention includes a transformer connected to the power circuit from which the aforementioned components of the present invention receive their power. The transformer has a takeoff winding which is connected to a normally open contact of the relay. Primary windings are connected in series to the takeoff winding with a selected one of the two primary windings being connected to a normally closed contact of the relay. A secondary transformer winding is electromagnetically connected proximate the primary and takeoff windings as is commonly known by those skilled in the art. If the relay is actuated by the timer to connect the normally open contact with the motor, current flows through the takeoff coil, which has a relatively small inductance and resistance as compared to the motor. If the relay is not actuated by the timer, the relay connects the normally closed contact to the motor, and current flows through the takeoff winding and selected ones of the primary windings depending on the voltage selected to power the motor. A predominant portion of the voltage available is dropped across the selected combination of windings thereby limiting the voltage drop across the motor to a level insufficient to power the same.

BRIEF DESCRIPTION OF THE DRAWINGS

Apparatus embodying features of my invention are depicted in the accompanying drawings which form a portion of this disclosure and wherein.

FIG. is a schematic of the present invention operatively connected to a grain transport system.

DESCRIPTION OF A PREFERRED EMBODIMENT

Figure 1:
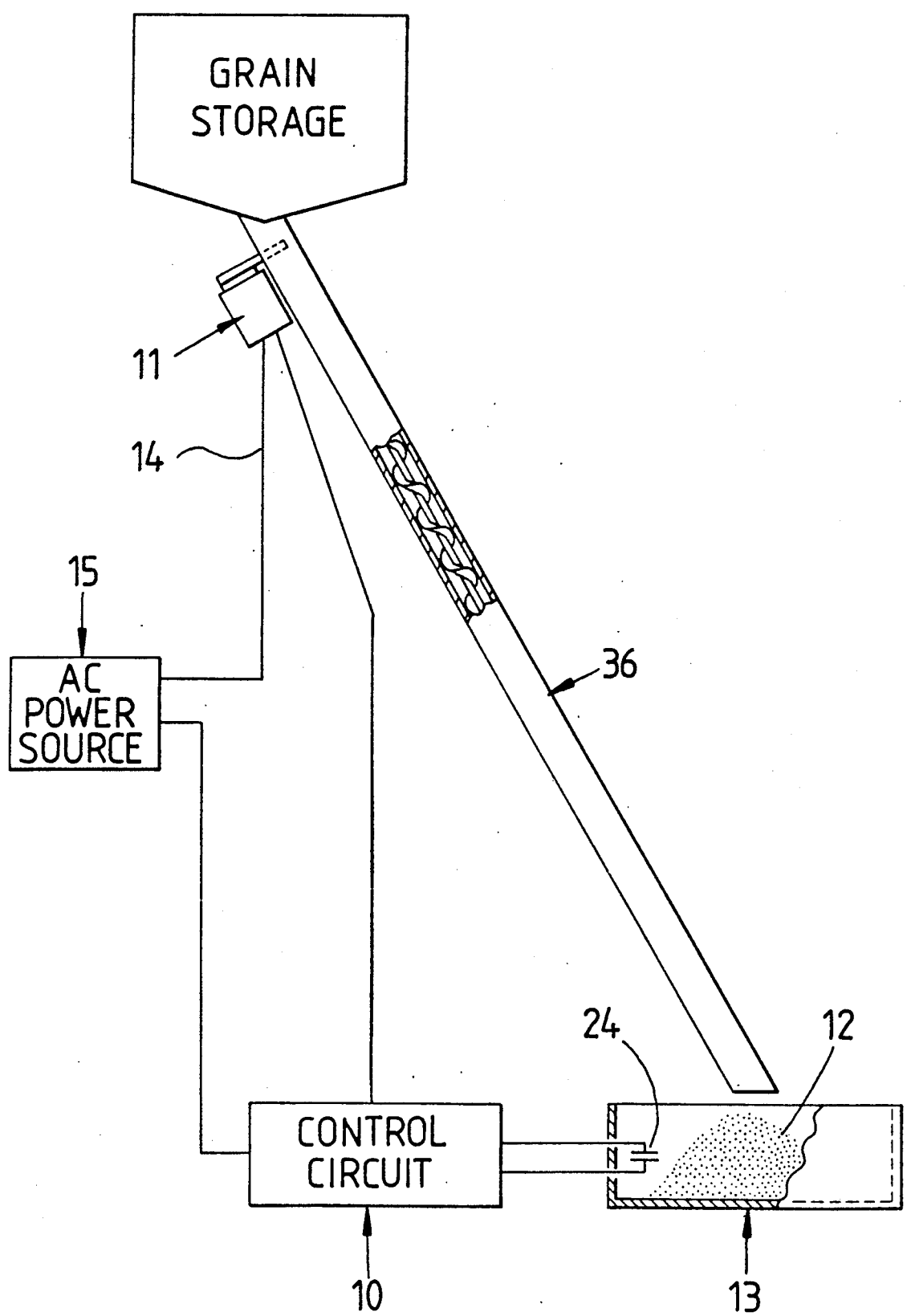
Figure 2:
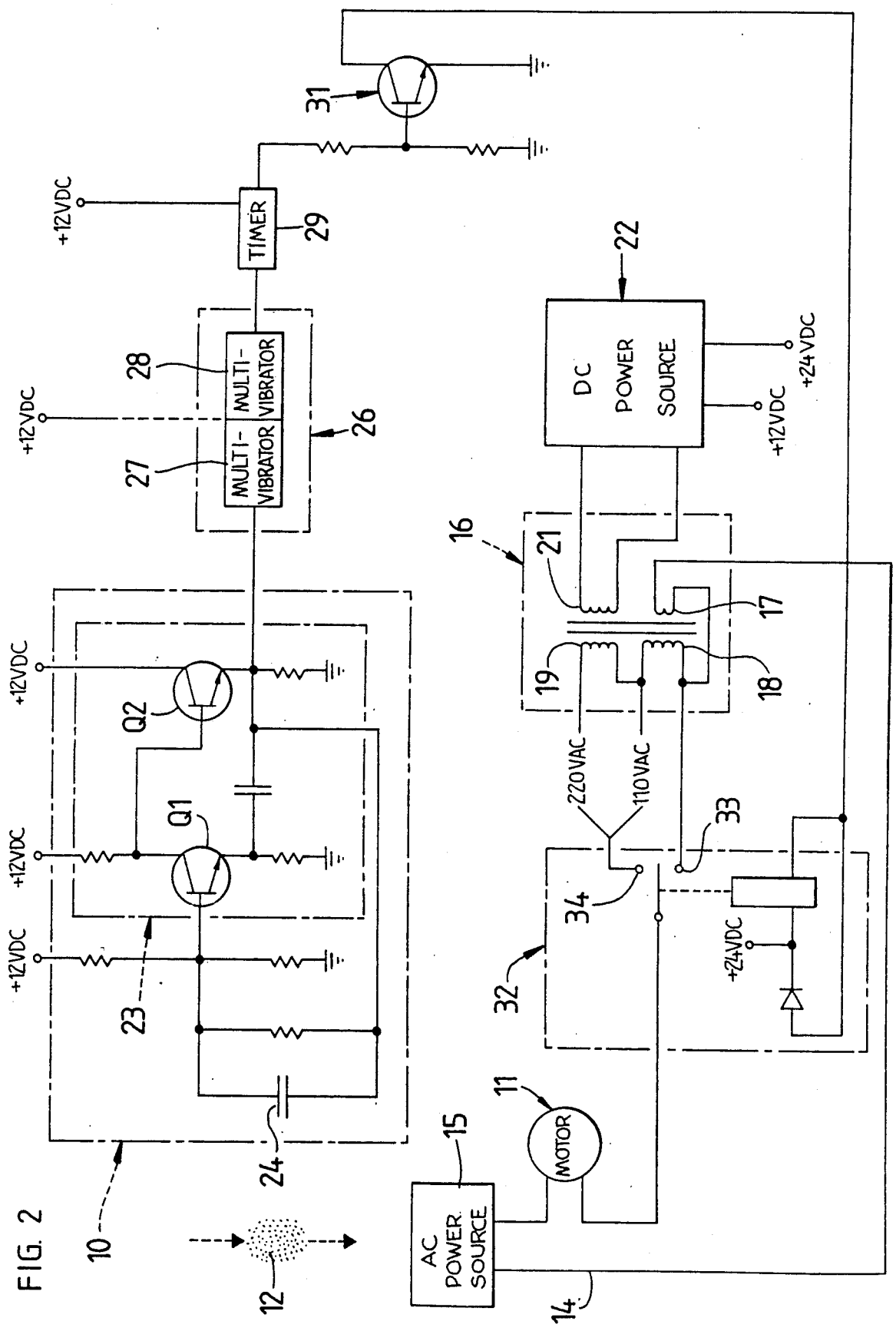
FIG. 2 is a schematic of the present invention.

Referring to the drawings for a clearer understanding of the invention, it may be seen that the present invention is a control circuit, shown generally at 10, for a motor 11 which moves objects 12 such as grain or feed relative to a material handling device 13 such as a bin or hopper as shown in FIG. 2. Our control circuit is powered by the power circuit 14 of motor 11 from the remote AC power source 15 which may either be 110 v AC or 220 v AC. As is shown in FIG. 1, the control circuit is coupled to the power circuit 14 by means for changing the voltage drop across the motor 11, wherein said changing means includes a transformer 16 which has a takeoff winding 17 of low impedance connected in series with primary windings 18 and 19 which are high impedance windings and are center tapped to accommodate either 220 v AC or 110 v AC as is common. A secondary winding 21 of the transformer 16 is electromagnetically connected to the primary windings 18 and 19 and the takeoff winding 17 and functions as a power supply for the control circuit and supplies alternating current to a power supply circuit 22 to provide a DC voltage at +12 v DC and +24 v DC to the control circuit. The control circuit itself includes means connected to the power circuit 14 for controlling the changing means, wherein the controlling means includes signal producing means having an RC oscillator circuit 23 which includes oscillator transistors $Q_1$ and $Q_2$ and an electrical element primarily being a capacitor 24 which is variable in capacitance dependent upon the proximity of objects 12 thereto. The RC oscillator circuit 23 oscillates at a first frequency, e.g. 300 khz unless the capacitance of capacitor 24 is varied by the presence of the object 12. The RC oscillator circuit 23 is electrically connected to a signal conditioning means which includes a multivibrator circuit 26 having a pair of staged retriggerable one shot multivibrators 27 and 28. The second multivibrator 28 is electrically connected to a reset pin (not shown) of a timer 29 which in turn is connected to a control transistor 31 which functions as a means for actuating the changing means responsive to the control signal. The control transistor 31 is electrically connected to a relay 32 which has a normally open contact 33 and a normally closed contact 34, wherein the relay functions as a means for selectively directing current flow through the primary windings 18 and/or 19 and the takeoff winding 17 or through the takeoff winding 17 alone responsive to the controlling means.

In operation, the presence of object 12, which may be grain in the material handling device 13, varies the capacitance across the capacitor 24 causing the oscillator circuit 23 to oscillate at a second frequency. The second frequency of the oscillator circuit 23 is used to input a signal to the multivibrator circuit 26. As long as the signal remains at the second frequency to the multivibrator circuit 26, multivibrator 28 will have its digital output held high, thus the timer 29 will be held in reset and control transistor 31 will be turned off. The normally closed contact 34 connects the motor to the AC power source 15 through a selected one or both of primary windings 18 and 19 and the takeoff winding 17. In as much as the impedance of the primary windings is high compared to the motor 11, the line voltage is dropped across the primary windings and does not significantly affect the motor 11. In other words, the motor 11 is inoperative. Secondary winding 21 is electromagnetically coupled to the primary windings to provide DC voltage to the control circuit even though the motor 11 is not running.

When the grain in the hopper 13, i.e. the object 12, moves away from the capacitor 24, the capacitance changes and the RC oscillator 23 sends a 300 khz signal to the multivibrator 27 causing the output of multivibrator 28 to go low thus causing the timer 29 to send a digital voltage output or control signal to the control transistor 31 which causes the normally open contact 33 of the relay 32 to close. Current path for the motor circuit 14 is thus established through the motor 11 and the takeoff winding 17 only. In as much as winding 17 is a low impedance winding, the motor drops the line voltage and operates a conveyor 36 to deliver grain to the hopper 13 for a period of time to replenish the hopper 13. When the motor 11 has timed out, grain is again proximal the capacitor 24 and the motor 11 will be turned off by the control circuit. Note that the high motor current and relatively few windings of the takeoff winding 17 are sufficient to induce the necessary current to the secondary winding 21 to provide the DC voltage for use by the control circuitry while the motor is running.

From the foregoing, it may be seen that we have devised an inexpensive yet effective way to maintain material levels in a hopper or the like while running the associated motor only as needed, and without using an outside source of electricity. The control components are not in line with the motor circuitry thus this system can be easily installed to retrofit existing motor circuits to provide an excellent control system therefore.

While we have shown our invention in one form, it will be obvious to those skilled in the art that it is not so limited but is susceptible of various changes and modifications without departing from the spirit thereof.

What I claim is:

1. Apparatus for sensing the presence of feed material in a hopper wherein said feed material is converged to said hopper by a motor driven conveyor and said motor is connected to a source of alternating current electricity, comprising in combination therewith:
   (a) a primary transformer winding in series connection with said motor and said source, said primary transformer winding having a high inductance relative to said motor;
   (b) a takeoff transformer winding in series connection with said source and said motor, said takeoff winding having a low impedance relative to said motor;
   (c) a secondary transformer winding electromagnetically coupled to said primary transform winding and said takeoff transformer winding to receive electrical energy therefrom to provide a source of electrical energy at all times;
   (d) electrically powered means operatively connected to said secondary transformer winding and receiving electrical energy therefrom at all times, for controlling said electrically operated relay responsive to the presence of feed material in said hopper; and
   (e) an electrically operated relay providing selective series connection between said motor and said primary transformer winding and between said motor and said takeoff transformer winding such that series connection of said motor and said primary transformer winding prevents operation of said motor and that series connection of said motor and said takeoff transformer winding enables operating of said motor, said motor remaining securely connected with said AC power source at substantially all times.

2. An improvement in material transport control apparatus wherein a driven conveyor system powered by an electric motor receiving AC electricity from a source wherein the improvement comprises:
   (a) a primary transformer winding electrically connected in series with said electric motor and having an inductance which is much larger than the electric motor's inductance such that a minimal voltage drop appears across said motor;
   (b) a takeoff transformer winding electrically connected in series with said electric motor and having an inductance which is much smaller than said electric motor's inductance;
   (c) a transformer secondary winding electromagnetically coupled to said primary takeoff transformer winding to generate electrical power from either said primary takeoff transformer winding; and
   (d) means for selectively removing said primary transform winding from series connection with said motor responsive to the level of material at a predetermined point third inductor means electromagnetically coupled to said first and second inductor means to provide a constant DC power supply to said means for selectively removing.

3. Apparatus for controlling the motor in a material delivery system wherein said motor drives a conveyor to deliver material to a storage receptacle, said motor being an AC motor with said motor to receive electrical power comprising in combination therewith:
   (a) first inductor means serially connected with said motor and having a large inductance relative to said motor;

(b) second inductor means serially connected with said motor and having a small inductance relative to said motor; and (c) means for selectively removing said first inductor from serial connection with said motor such that electrical current through said motor is sufficient to operate said motor responsive to a predetermined level of material in said storage receptacle and in said conveyor system.

4. Apparatus as described in claim 3, wherein said selectively directing means comprises an electrically operated relay providing selective series connection between said motor and said primary transformer winding and between said motor and said takeoff transformer winding.

5. Apparatus as described in claim 4 wherein said primary transformer winding and said takeoff winding are series connected and said electrically operated relay is electrically connected intermediate said primary transformer winding and said takeoff winding and between said motor and said primary transformer winding.

* * * * *